United States Patent
Rice (10) Patent No.: US 10,859,318 B2
(45) Date of Patent: Dec. 8, 2020

(54) SERIAL THERMOSYPHON

(71) Applicant: J R Thermal LLC, Austin, TX (US)

(72) Inventor: Jeremy Rice, Austin, TX (US)

(73) Assignee: J R Thermal, LLC, Austin, TX (US)

( * ) Notice: Subject to any disclaimer, the term of this patent is extended or adjusted under 35 U.S.C. 154(b) by 0 days.

(21) Appl. No.: 15/896,416

(22) Filed: Feb. 14, 2018

(65) Prior Publication Data

US 2018/0231326 A1 Aug. 16, 2018

Related U.S. Application Data

(60) Provisional application No. 62/459,938, filed on Feb. 16, 2017.

(51) Int. Cl.
*F28D 15/02* (2006.01)
*H01L 23/427* (2006.01)

(52) U.S. Cl.
CPC ..... *F28D 15/0266* (2013.01); *F28D 15/0275* (2013.01); *F28D 15/0283* (2013.01); *H01L 23/427* (2013.01)

(58) Field of Classification Search
CPC .............. F28D 15/0266; F28D 15/0275; F28D 15/0283; H01L 23/427
See application file for complete search history.

(56) References Cited

U.S. PATENT DOCUMENTS

| | | | | |
|---|---|---|---|---|
| 2007/0273024 A1* | 11/2007 | Madsen | ............... | F28D 15/0266 257/715 |
| 2008/0164010 A1* | 7/2008 | Kang | .................. | F28D 15/0266 165/104.26 |
| 2010/0061062 A1* | 3/2010 | Madsen | ............... | F28D 15/0266 361/701 |
| 2011/0265975 A1* | 11/2011 | Koivuluoma | ......... | H01L 23/427 165/67 |
| 2012/0132402 A1* | 5/2012 | Aoki | ................... | F28D 15/0266 165/104.21 |
| 2013/0025826 A1* | 1/2013 | Sakamoto | ............ | F28D 15/0266 165/104.21 |
| 2013/0077245 A1* | 3/2013 | Gradinger | ................ | F28D 1/035 361/700 |
| 2013/0104592 A1* | 5/2013 | Cottet | ................. | H05K 7/20672 62/419 |
| 2013/0107455 A1* | 5/2013 | Cottet | ................. | H05K 7/20672 361/694 |
| 2013/0186601 A1* | 7/2013 | Monson | ............. | H05K 7/20672 165/104.26 |
| 2014/0116653 A1* | 5/2014 | Lange | .................... | F21V 29/006 165/104.21 |
| 2015/0062821 A1* | 3/2015 | Yoshikawa | ................ | G06F 1/20 361/700 |
| 2015/0241094 A1* | 8/2015 | Blomberg | ............... | F25B 39/02 62/119 |

(Continued)

*Primary Examiner* — Jon T. Schermerhorn, Jr.
(74) *Attorney, Agent, or Firm* — DuBois, Bryant & Campbell, LLP; William D. Wiese (57) ABSTRACT

A thermosyphon having a condenser located below the evaporator, or an evaporator above the condenser, is presented. Various embodiments include serially configured evaporators and condensers, so that the excess pressure head from any condenser to evaporator liquid coupling may be utilized to overcome deficient pressure head in a subsequent condenser to evaporator liquid coupling.

20 Claims, 8 Drawing Sheets

(56) References Cited

U.S. PATENT DOCUMENTS

| | | | |
|---|---|---|---|
| 2016/0007501 A1* | 1/2016 | Nakanishi | F28D 15/0266 165/103 |
| 2016/0016246 A1* | 1/2016 | Bugby | F28D 1/0477 228/101 |
| 2016/0147034 A1* | 5/2016 | Shoujiguchi | F28D 15/02 359/512 |
| 2016/0338226 A1* | 11/2016 | Sakamoto | F28D 15/0266 |

* cited by examiner

SERIAL THERMOSYPHON

PRIORITY STATEMENT UNDER 35 U.S.C. § 119 & 37 C.F.R. § 1.78

This non-provisional application claims priority based upon a prior U.S. Provisional Patent Application Ser. No. 62/459,938 filed Feb. 16, 2017, in the name of Jeremy Rice entitled "SERIAL THERMOSYPHON," the disclosures of which are incorporated herein in their entirety by reference as if fully set forth herein.

BACKGROUND OF THE INVENTION

Passive heat transfer devices are of much interest in applications such as electronics cooling. Heat pipes are commonly used in these applications. They are liquid and vapor devices in which liquid is pumped through capillarity from the condenser to the evaporator. The pumping effect in this device requires a wick, which produces a high pressure loss and limits the maximum heat transport distance and/or power that can be supported before dry-out occurs.

Figure 1:
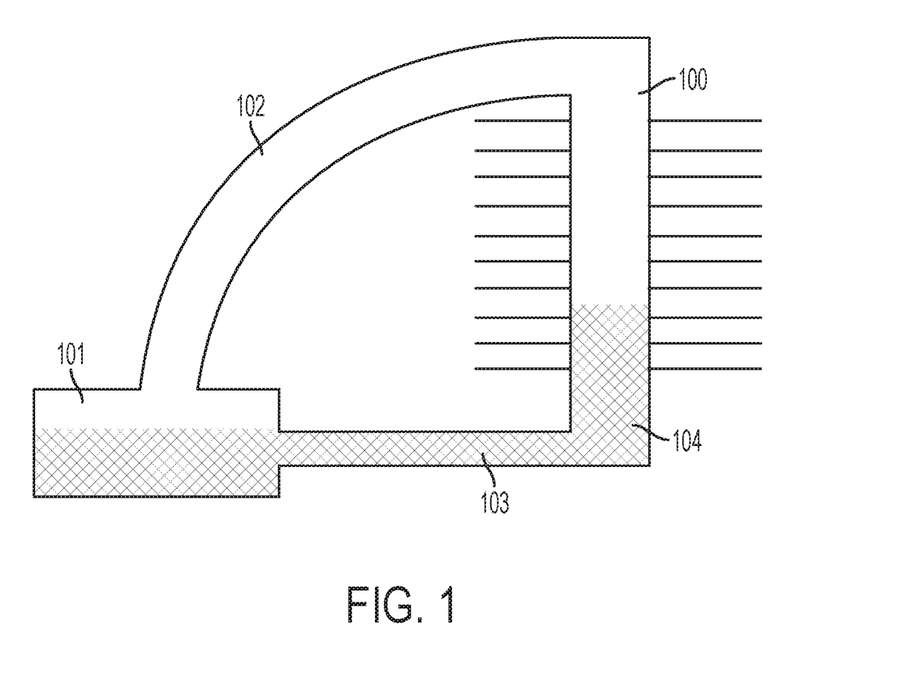
FIG. 1 is a schematic of thermosyphon design in accordance with prior art.

Another technology node that is useful is a thermosyphon, a depiction of which is shown in FIG. 1. In operation, liquid 104 is vaporized in an evaporator 101. The vapor then travels through a tube 102 to the condenser 100. Heat is removed from the condenser 100 causing the liquid 104 to accumulate at the bottom. The accumulated liquid 104 in the condenser 100 is driven by gravity through a liquid tube 103 back to the evaporator 101. In accordance with prior art, all of the condensation occurs above the top of the pool of liquid 104 in the condenser 100, which is above the evaporator 101.

Elevation limitation of the condenser 100, relative to the evaporator 101, can limit the utility of utilizing thermosyphon technology for a number of applications. The evaporators in these devices are typically pool boiling devices with an enhanced surface that may consist of fins, a porous layer or even an etched surface. The maximum boiling heat transfer coefficient can be limited in this device because there are a finite amount of nucleation sites, and therefore, a limited length of solid/liquid/vapor contact, where the heat transfer rate is the highest.

There is a need, therefor, for a thermosyphon device which operates irrespective of the location of the condenser relative to the evaporator.

SUMMARY OF THE INVENTION

This invention is advancement in thermosyphon technology intended for use in electronics cooling applications. The invention is useful to enable condensation below the evaporator. In various embodiments, the invention utilizes serially configured evaporators and condensers, so that the excess pressure head from any condenser to evaporator liquid coupling may be utilized to overcome deficient pressure head in a subsequent condenser to evaporator liquid coupling. The proportion of the region below the evaporator in which condensation can occur is in a proportion of approximately fifty to ninety percent of the height above the evaporator in which condensation can occur.

The foregoing has outlined rather broadly certain aspects of the present invention in order that the detailed description of the invention that follows may better be understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 2:
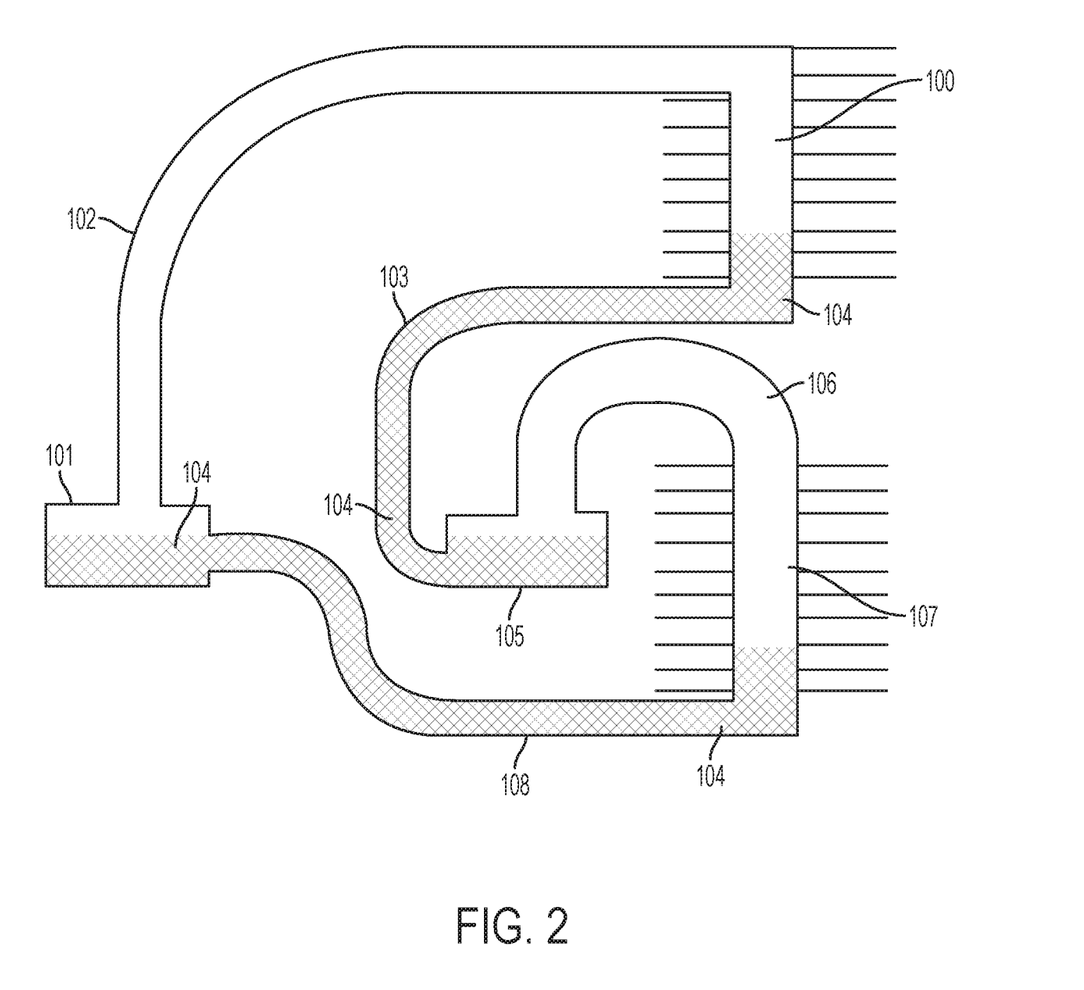
FIG. 2 is a schematic of one embodiment of the present invention.

The present invention is directed to improved methods and systems for, among other things, the use of thermosyphons in heating and cooling applications. The configuration and use of the presently preferred embodiments are discussed in detail below. It should be appreciated, however, that the present invention provides many applicable inventive concepts that can be embodied in a wide variety of contexts other than thermosyphon. Accordingly, the specific embodiments discussed are merely illustrative of specific ways to make and use the invention, and do not limit the scope of the invention. In addition, the following terms shall have the associated meaning when used herein:

Referring now to FIG. 2, which depicts one embodiment of the present invention consisting of a first evaporator 101, in which vapor flows through a tube 102 to a first condenser 100. A liquid 104 from the first condenser 100 flows to a second evaporator 105 through a first liquid tube 103. Vapor flows from the second evaporator 105 to a second condenser 107 through a second vapor tube 106. Liquid 104 from the second condenser 107 then flows to the first evaporator 101 through liquid tube 108, thereby closing the serial thermosyphon loop. The first evaporator 101 and the second evaporator 105 are thermally connected to a heat generating component, such as a central process unit, an insulated gate bipolar transistor, or some other electronic component.

In this embodiment, the first evaporator 101 and the second evaporator 105 are located at the same elevation, with respect to gravity. The first condenser 100 is elevated above the first evaporator 101, and the second condenser 107 is at a lower elevation than the first condenser 100. In this embodiment, the liquid 104 pool height in the second condenser 107 is lower than the liquid 104 pool height in the first evaporator 101. The liquid 104 in the second condenser 107 is able to be passively pumped against gravity to the first evaporator 101 because of the excess pressure buildup from the liquid 104 pool height in the first condenser 100 with respect to the liquid 104 pool height in the second evaporator 105.

There are several considerations when implementing the foregoing embodiment of the present invention. For example, one must consider the height of the first condenser 100 relative to the second evaporator 105, compared to the height of the second condenser 107 relative to the first evaporator 101. More specifically, the relative liquid 104 pool height of the first condenser must be greater than the relative liquid 104 pool height of the second condenser, in order to have sufficient pressure build up to overcome the hydrodynamic losses associated with the fluid flow through each of the components and tubing.

A second consideration is ensuring that the flow of liquid 104 to each evaporator 101, 105 is sufficient to balance the amount which is vaporized through heat addition. Since there are many situations in which the heat input to the first evaporator 101 does not match the heat input of the second evaporator 105, there is the potential for insufficient liquid 104 flow to either evaporator 101, 105 to occur. In order to avoid the condition where insufficient liquid 104 flow can occur, it may be necessary to design for some liquid 104 to be carried by the vapor, by bubble pump or other means, in each of the vapor tubes 102, 106. The amount of liquid 104 carried in each vapor tube 102, 106 can be self-regulated by the differences of the liquid 104 pool heights.

A third consideration is ensuring that each condenser 100, 107 is sized to allow for complete condensation of vapor. A situation that could prevent the system from working is having a greater heat load into the first evaporator 101 than the second evaporator 105, yet, the first condenser 100 is smaller, and capable of removing less heat, than the second condenser 107. In this situation, incomplete condensation of vapor in the first condenser 100 can prevent liquid 104 pool build up in the first condenser 100, which provides the pressure head needed for the entire system to function. To avoid this situation, a practitioner may oversize the first condenser 100. If it is sufficiently over-sized, the liquid 104 pool height inside the condenser 100 may increase, effectively deactivating a portion of the condenser 100 from removing heat. The same concept may be employed with the second condenser 107, thereby passively regulating the heat removal from each portion.

Figure 3:
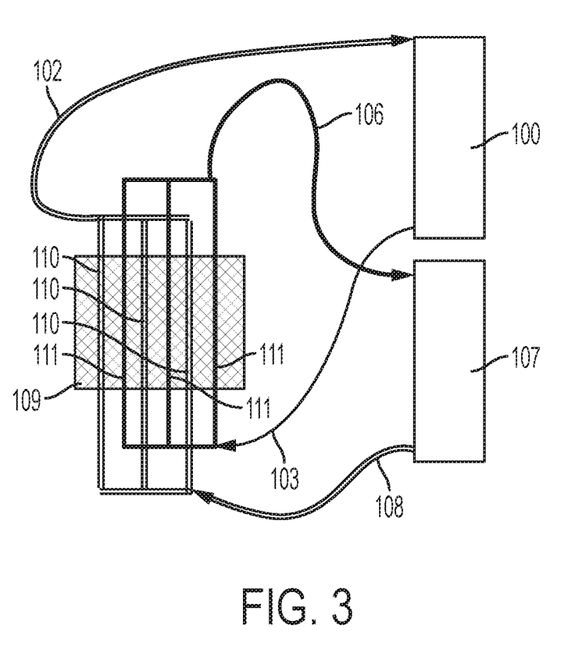
FIG. 3 is a schematic of another embodiment of the present invention.

There are many applications where there may only be a single heat generating component to be cooled, while still maintaining a need to enable condensation below the evaporator. Referring now to FIG. 3, wherein an evaporator 109 consists of a series of parallel channels 110. A first set of evaporator channels 110 connects to the first vapor tube 102 through a manifold, connected to the first condenser 100. Liquid from the first condenser 100, goes through a first liquid tube 103 to a second set of evaporator channels 111. Vapor then exits the second set of evaporator channels 111, through a manifold, to a second vapor tube 106, which connects to a second condenser 107. Liquid from the second condenser 107, goes through a second liquid tube 108 to the first set of evaporator channels 110. The considerations described above also apply to this embodiment, and will not be repeated for conciseness.

The embodiment described immediately above has another layer of self-regulation of heat load into either the first condenser 100 or the second condenser 107, since the heat load into each channel will regulate based on the liquid supplied to each set of evaporator channels. A schematic of a bottom end view of the evaporator 109 is presented in FIG. 4A. The first set of channels 110 does not extend through the end of the evaporator 109, but the second set of channels 111 does extend through this end. Having only a second set of channels 111 accessible to the bottom end of the evaporator 109 enables a manifold to be easily connected to the second set of flow channels 111.

Figure 4A:
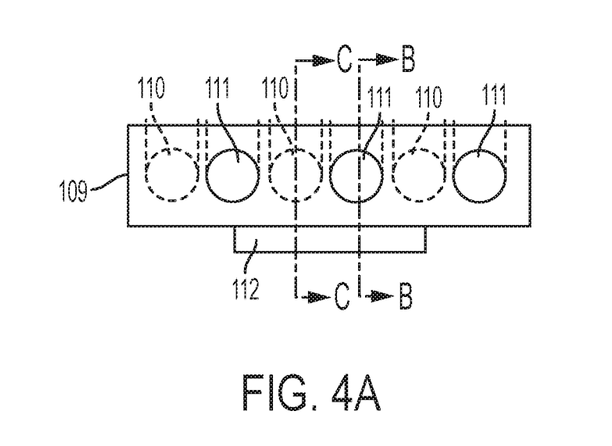
FIG. 4A is an end view of the embodiment of the evaporator shown in FIG. 3.
Figure 4B:
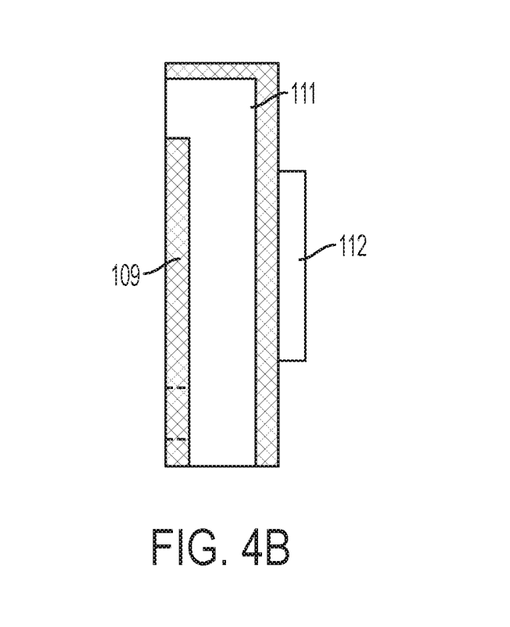
FIG. 4B is a cross-sectional view of the embodiment of the evaporator shown in FIG. 3.

The cross-sectional view B, through a single channel in the second set of flow channels 111 from FIG. 4A, is presented in FIG. 4B. The channel 111, enters the bottom end of the evaporator 109, and leaves the top portion through the opposing face to which the heating device 112 is applied. Only the second set of flow channels 111 is configured to leave this portion of the evaporator 109, allowing for easy integration of an exit manifold.

Figure 4C:
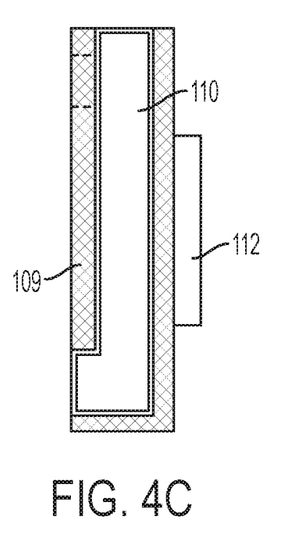
FIG. 4C is a second cross-sectional view of the embodiment of the evaporator shown in FIG. 3.

A cross-section of a channel in the second set of flow channels 110 is presented in FIG. 4C. This flow channel 110 has an entry at the bottom portion of the evaporator 109, on the opposing face as the heat device 112 is applied. The exit of the flow channel 110 is at the top face of the evaporator. The position of the entry and exit locations of the first set of flow channels 110 is at a different location than the second set of flow channels 111, making the connections to a manifold accessible.

In various embodiments, the first set of flow channels 110 and second set of flow channels 111 in the evaporator 109, may be configured to have surface texture, such as straight grooves, helical grooves, screen mesh, sintered powder mesh, or other surface enhancement to promote boiling heat transfer. While the flow channels 110, 111 are presented as circular, they may take the form of many geometries, such as rectangular, triangular, or any other form.

Figure 5:
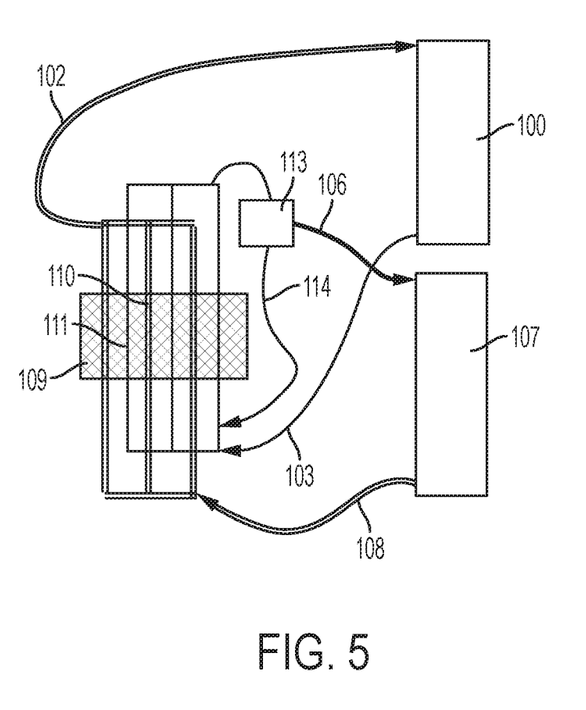
FIG. 5 is another embodiment of the present invention.

Referring now to FIG. 5 which depicts another embodiment of the present invention in which a liquid-vapor separator 113 is positioned in the second vapor tube 106. The liquid-vapor separator 113 also has a liquid redistribution tube 114, which recirculates the pumped liquid exiting the evaporator 109 through the second set of flow channels 111 back to the entrance of the second set of flow channels 111. The liquid-vapor separator 113 helps prevent flooding of the second condenser 107.

Additionally, the liquid-vapor separator 113 can act as a liquid reservoir. During the start-up phase of operation, the second condenser 107 may have a substantial amount of liquid inside of it, to ensure that liquid fills the evaporator 109 initially. Having liquid inside the evaporator 109 at an initial condition is a requirement for the system to start-up. This requirement can lead to an excess volume of liquid in the system. The liquid-vapor separator 113 can store this liquid, thus keeping the interior surfaces of the condensers 107 exposed to vapor, promoting efficient condensation heat transfer. The location of the liquid-vapor separator 113, should not be too high with respect to the first condenser 100, since its function as a reservoir would be diminished and the excess liquid could be stored in the first condenser 100 and not the liquid-vapor separator 113.

Figure 6:
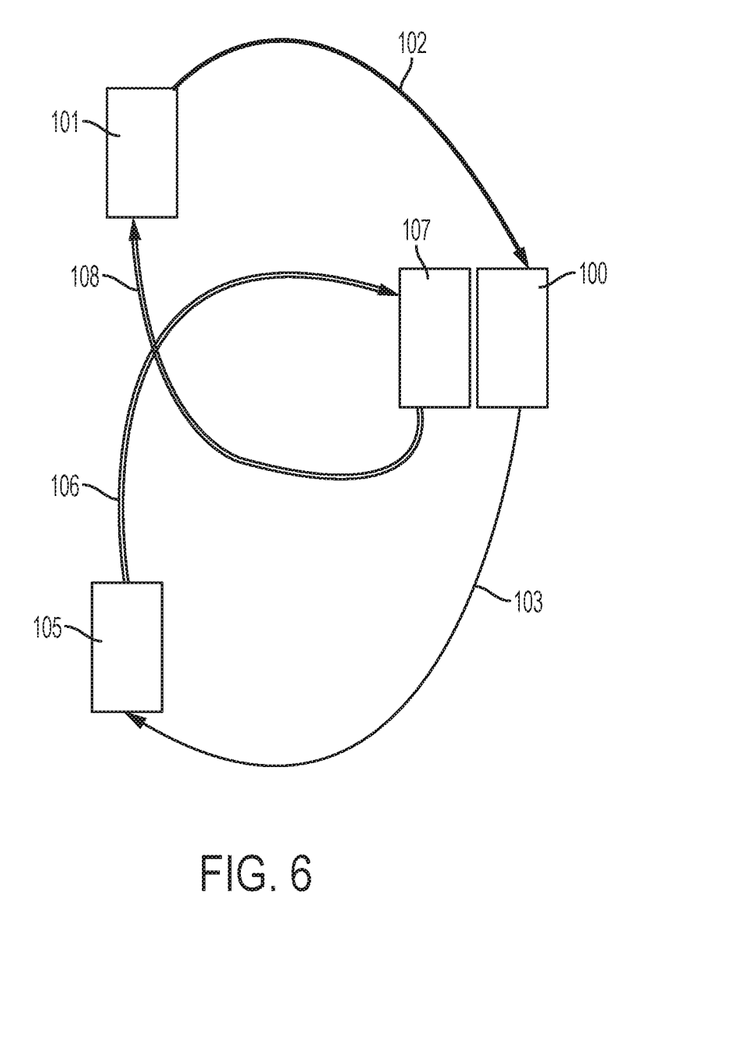
FIG. 6 is another embodiment of the present invention.

Referring now to FIG. 6 which depicts yet another embodiment of the present invention. This embodiment is an inverse of the first embodiment of the present invention described above. The serial connectivity of the first evaporator 101 to the first condenser 100 to the second evaporator 105 to the second condenser 107 is the same as the first embodiment. The first evaporator 101 is located at the highest elevation, while the second evaporator 105 is located at the lowest elevation, with respect to gravity. The first condenser 100 and second condenser 107 are located at a central elevation. The excess pressure head from the difference in liquid pool height from the first condenser 100 to the second evaporator 105 is what drives the deficient pressure head from the second condenser 107 to the first evaporator 101.

Since the first evaporator 101 is at the highest elevation, there may be additional start-up considerations. For instance, the heat load should be applied to the second evaporator 105 first, to help promote the pumping of refrigerant to the first evaporator 101. Alternate strategies, may be to add a mass to the first evaporator 101 or a solid-to-liquid phase change material, so that the temperature may be temporarily regulated, until the system is fully functional and the liquid supply is adequate to balance the vaporization. A reservoir may also be added above the first evaporator 101 to help promote liquid existence in the first evaporator 101 prior to start-up.

Figure 7:
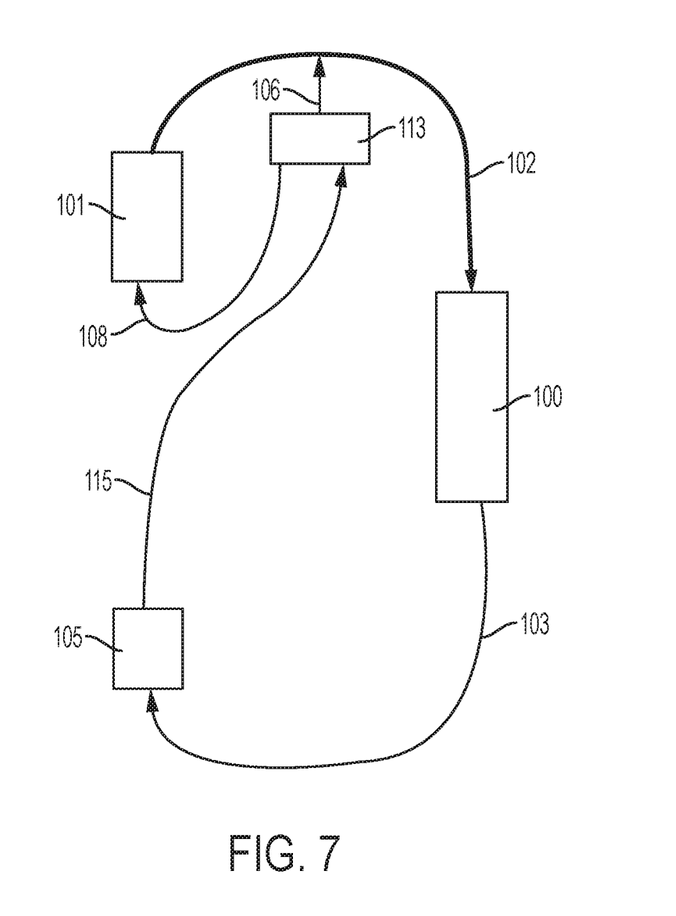
FIG. 7 is yet another embodiment of the present invention.

Referring now to FIG. 7, wherein another embodiment of the present invention has a liquid-vapor separator 113, positioned above the first evaporator 101. While this embodiment only has one condenser 100, the liquid-vapor separator 113 acts like a second condenser, in that the liquid that is separated, is distributed to the first evaporator 101 through a liquid distribution tube 108. In order for liquid to be received by the liquid-vapor separator 113, liquid must be entrained in the vapor tube 115 leaving the second evaporator 105. In this regard, the second evaporator 105 and vapor tube 115 act as a bubble pump. The vapor that carries the liquid upward, is combined with the first vapor tube 102 through a vapor connection 106 leaving the liquid-vapor separator.

In this embodiment, the second evaporator 105 may be configured, not for cooling an electronics component, but rather, as a heat activated pump, to lift liquid to the first evaporator 101. In this scenario, the power requirements of the second evaporator 105 need only be enough to supply liquid, equal or slightly greater than the amount of liquid vaporized in the first evaporator 101. While the second evaporator 105 may not necessarily be configured to cool an electronics component, it may be configured to do so.

While the embodiments discussed thus far contain a limited number of evaporators and condensers (e.g. up to two of each), the same principles may be extended to three, four or more serially implemented evaporators and condensers. For instance, in a system with n evaporators and n condensers, the connectivity may be arranged as follows:

The first evaporator connects to the first condenser via a first vapor tube and so on until the $n^{th}$ evaporator connects to the $n^{th}$ condenser via the $n^{th}$ vapor tube.

The first condenser will connect to the second evaporator via the first liquid tube and so on until the $n^{th}$ condenser connects to the first evaporator via the $n^{th}$ liquid tube, thus completing the loop.

Also, the same principles may be used to implement evaporators and condensers that are either horizontally or vertically configured.

The configurations of the various embodiments with multiple condensers are represented as separate condenser modules in the schematics presented. The schematics are intended to represent the refrigerant circuitry and the condenser nomenclature is intended to represent the structure in which the working fluid wets. The condensers may then be connected into a common assembly by fins or other structural elements.

The phase change fluid in any of the embodiments presented herein may be water, ammonia, alcohol, a hydrofluorocarbon (HFC), a hydrofluoroolefin (HFO), a hydrofluoroether (HFE), sodium or other appropriate working fluid depending on the desired operating temperature and physical constraints of the design. Also, gravity may be replaced by a centrifugal or other inertial force, where gravity isn't reliable or available, as in space applications.

While the present system and method has been disclosed according to the preferred embodiment of the invention, those of ordinary skill in the art will understand that other embodiments have also been enabled. Even though the foregoing discussion has focused on particular embodiments, it is understood that other configurations are contemplated. In particular, even though the expressions "in one embodiment" or "in another embodiment" are used herein, these phrases are meant to generally reference embodiment possibilities and are not intended to limit the invention to those particular embodiment configurations. These terms may reference the same or different embodiments, and unless indicated otherwise, are combinable into aggregate embodiments. The terms "a", "an" and "the" mean "one or more" unless expressly specified otherwise. The term "connected" means "communicatively connected" unless otherwise defined.

When a single embodiment is described herein, it will be readily apparent that more than one embodiment may be used in place of a single embodiment. Similarly, where more than one embodiment is described herein, it will be readily apparent that a single embodiment may be substituted for that one device.

In light of the wide variety of methods for configuring thermosyphons known in the art, the detailed embodiments are intended to be illustrative only and should not be taken as limiting the scope of the invention. Rather, what is claimed as the invention is all such modifications as may come within the spirit and scope of the following claims and equivalents thereto.

None of the description in this specification should be read as implying that any particular element, step or function is an essential element which must be included in the claim scope. The scope of the patented subject matter is defined only by the allowed claims and their equivalents. Unless explicitly recited, other aspects of the present invention as described in this specification do not limit the scope of the claims.

I claim:

1. A thermosyphon, comprising:
   a first evaporator;
   a first condenser;
   a second evaporator;
   a second condenser, with the relative liquid pool height of the first condenser being greater than the relative liquid pool height of the second condenser;
   a first vapor tube fluidly connecting the first evaporator to the first condenser;
   a first liquid tube fluidly connecting the first condenser to the second evaporator;
   a second vapor tube fluidly connecting the second evaporator to the second condenser; and
   a second liquid tube fluidly connecting the second condenser to the first evaporator.

2. The thermosyphon of claim 1, wherein the first evaporator consists of a first set of parallel evaporator channels and the second evaporator consists of a second set of parallel evaporator channels.

3. The thermosyphon of claim 1, wherein the first evaporator and the second evaporator are located at the same elevation with respect to gravity.

4. The thermosyphon of claim 1, wherein the first evaporator and the second evaporator are located at the same elevation with respect to gravity, and the first condenser is elevated above the first evaporator and the second condenser is positioned below the first condenser with respect to gravity.

5. The thermosyphon of claim 1, wherein liquid is carried by a bubble pump in the first vapor tube.

6. The thermosyphon of claim 1, wherein the first condenser is oversized with respect to the second condenser.

7. The thermosyphon of claim 1, wherein a liquid-vapor separator is positioned in the second vapor tube.

8. The thermosyphon of claim 1, wherein a liquid-vapor separator is positioned in the second vapor tube, the liquid-vapor separator being fluidly connected to the second evaporator so that liquid exiting the first evaporator recirculates liquid back to the second evaporator to help prevent flooding of the second condenser.

9. The thermosyphon of claim 1, wherein the first evaporator and the second evaporator are thermally connected to the same heat generating component.

10. The thermosyphon of claim 1, wherein liquid in the first liquid tube and second liquid tube is selected from the group consisting of water, ammonia, alcohol, hydrofluorocarbon, hydroflouroolefin and hydroflouroether.

11. A method for removing heat from a heat generating component, comprising:
fluidly connecting a first evaporator to a first condenser through a first vapor tube;
fluidly connecting the first condenser to a second evaporator through a second vapor tube, with the relative liquid pool height of the first condenser being greater than the relative liquid pool height of the second condenser;
fluidly connecting the second condenser to the first evaporator through a second liquid tube; and
wherein the first evaporator and the second evaporator are thermally connected to one or more heat generating components.

12. The method for removing heat from a heat generating component of claim 11, wherein the first evaporator consists of a first set of parallel evaporator channels and the second evaporator consists of a second set of parallel evaporator channels.

13. The method for removing heat from a heat generating component of claim 11, wherein the first evaporator and the second evaporator are located at the same elevation with respect to gravity.

14. The method for removing heat from a heat generating component of claim 11, wherein the first evaporator and the second evaporator are located at the same elevation with respect to gravity, and the first condenser is elevated above the first evaporator and the second condenser is positioned below the first condenser with respect to gravity.

15. The method for removing heat from a heat generating component of claim 11, wherein liquid is carried by a bubble pump in the first vapor tube.

16. The method for removing heat from a heat generating component of claim 11, wherein the first condenser is oversized with respect to the second condenser.

17. The method for removing heat from a heat generating component of claim 11, wherein a liquid-vapor separator is positioned in the second vapor tube.

18. The method for removing heat from a heat generating component of claim 11, wherein a liquid-vapor separator is positioned in the second vapor tube, the liquid-vapor separator being fluidly connected to second evaporator so that liquid exiting the first evaporator recirculates liquid back to the second evaporator to help prevent flooding of the second condenser.

19. The method for removing heat from a heat generating component of claim 11, wherein the first evaporator and the second evaporator are thermally connected to the same heat generating component.

20. The method for removing heat from a heat generating component of claim 11, wherein liquid in the first liquid tube and second liquid tube is selected from the group consisting of water, ammonia, alcohol, hydrofluorocarbon, hydroflouroolefin, hydroflouroether.

* * * * *